United States Patent
Fukazawa et al.

(10) Patent No.: US 8,784,951 B2
(45) Date of Patent: Jul. 22, 2014

(54) METHOD FOR FORMING INSULATION FILM USING NON-HALIDE PRECURSOR HAVING FOUR OR MORE SILICONS

(71) Applicant: ASM IP Holding B.V., Almere (NL)

(72) Inventors: Atsuki Fukazawa, Tama (JP); Hideaki Fukuka, Hachioji (JP)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 13/679,502

(22) Filed: Nov. 16, 2012

(65) Prior Publication Data

US 2014/0141625 A1    May 22, 2014

(51) Int. Cl.

| H01L 21/31 | (2006.01) |
|---|---|
| C23C 16/00 | (2006.01) |
| C23C 16/50 | (2006.01) |
| C23C 16/32 | (2006.01) |
| C23C 16/34 | (2006.01) |
| C23C 16/36 | (2006.01) |
| C23C 16/24 | (2006.01) |
| C23C 16/505 | (2006.01) |
| H01L 21/02 | (2006.01) |

(52) U.S. Cl.
CPC ...... *H01L 21/02167* (2013.01); *H01L 21/0217* (2013.01)
USPC ............ 427/578; 438/758; 438/792; 427/579

(58) Field of Classification Search
USPC .......................................... 427/579; 438/482
See application file for complete search history.

(56) References Cited

U.S. PATENT DOCUMENTS

| 2009/0104789 A1 | 4/2009 | Mallick |
| 2010/0124618 A1* | 5/2010 | Kobayashi et al. ............ 427/535 |
| 2010/0124621 A1* | 5/2010 | Kobayashi et al. ............ 427/579 |
| 2011/0086516 A1* | 4/2011 | Lee et al. ........................ 438/792 |
| 2011/0220874 A1 | 9/2011 | Hanrath |
| 2012/0003500 A1* | 1/2012 | Yoshida et al. ................ 428/688 |
| 2012/0164327 A1 | 6/2012 | Sato |
| 2012/0164842 A1 | 6/2012 | Watanabe |
| 2012/0295449 A1* | 11/2012 | Fukazawa ....................... 438/786 |
| 2013/0210241 A1* | 8/2013 | LaVoie et al. .................. 438/791 |

FOREIGN PATENT DOCUMENTS

WO    2010/039363    4/2010

* cited by examiner

*Primary Examiner* — Colleen Matthews
*Assistant Examiner* — Regan J Rundio
(74) *Attorney, Agent, or Firm* — Snell & Wilmer L.L.P.

(57) ABSTRACT

A method of forming an insulation film on a semiconductor substrate by plasma enhanced atomic layer deposition (PEALD), includes: (i) adsorbing a non-excited non-halide precursor having four or more silicon atoms in its molecule onto a substrate placed in a reaction space; (ii) supplying an oxygen-free reactant to the reaction space without applying RF power so as to expose the precursor-adsorbed substrate to the reactant; and (iii) after step (ii), applying RF power to the reaction space while the oxygen-free reactant is supplied in the reaction space; and (iv) repeating steps (i) to (iii) as a cycle, thereby depositing an insulation film on the substrate.

15 Claims, 3 Drawing Sheets

METHOD FOR FORMING INSULATION FILM USING NON-HALIDE PRECURSOR HAVING FOUR OR MORE SILICONS

BACKGROUND

1. Field of the Invention

The present invention relates generally to semiconductor integrated circuit manufacturing and, more particularly, to a method for forming a conformal insulation film constituted by, e.g., amorphous silicon or silicon nitride on a semiconductor substrate by plasma-enhanced atomic layer deposition (PEALD).

2. Description of the Related Art

For forming a silicon nitride by atomic layer deposition (ALD), a halide precursor is often used. This is because a halide precursor, especially a precursor containing chlorine, is characterized by its easy substitution treatment by heat reaction with $NH_3$. Since the reactivity of $NH_3$ or $H_2$ with a halide precursor is very high, unwanted deposition occurs inside an exhaust pipe or particles are generated as a result of mixing with other gases when a process takes place. Thus, to deal with the above problems, extra attention needs to be paid to the process conditions, and special modifications to the process sequence are required, and additional consideration of prevention of unwanted depositions to exhaust pipes is also required. Accordingly, the above methods face not only the cost increase problem but also the productivity decrease problem due to the process sequence being more complex and the process duration being prolonged.

Further, when a halide precursor is used, reactivity of substitution reaction with reactant gas depends on the reaction temperature, and when the reaction temperature is 300° C. or lower, reactivity with the reactant gas suffers, and step coverage which is also temperature-dependent tends to be lower than 90%.

Any discussion of problems and solutions involved in the related art has been included in this disclosure solely for the purposes of providing a context for some, not all, embodiments of the present invention, and it should not be taken as an admission that any or all of the discussion were known at the time the invention was made.

SUMMARY

As discussed above in relation to the background, when processing a nitride film such as a SiN film by PEALD, a combination of a halide precursor and $NH_3$ is often used in view of chemical adsorption and nitridation. Halide precursors have superior chemical adsorption properties and are characterized by easy substitution reaction with $NH_3$, $H_2$, etc. However, the use of halide precursors is associated with the problems discussed above.

The present inventors investigated use of non-halide precursors in order to solve the above problems caused by use of halide precursors, in depositing an insulation film such as films constituted by SiN, SiCN, amorphous Si (referred to as "a-Si"), etc. by PEALD. When evaluating non-halide precursors for depositing films constituted by SiN, SiCN, and a-Si, it was observed that chemical adsorption thereof was often blocked during a process of depositing the films. For improving chemical adsorption of non-halide precursors, the inventors increased the number of silicon atoms in the molecule of the precursors in combination with other conditions and confirmed that when the number of silicon atoms in the molecule was four or more, among other factors, the growth per cycle (GPC) of film using $NH_3$, $H_2$, $H_2/N_2$, etc. as a reactant gas reached a plateau, i.e., adsorption of the precursors on the surface of the substrate were saturated relative to the duration of supply time of the precursors and the duration of purge time. By selecting the type of reactant gas, for example, by using $H_2$, an a-Si film was formed, and by using $NH_3$, a SiCN film was formed. The step coverage of the obtained films was excellent. Accordingly, by using non-halide precursors, the problem of temperature-dependence of unwanted accumulations of by-products inside exhaust pipes and of reactivity with reactant gas, among other problems, has been effectively solved.

An embodiment of the present invention provides a method of forming an insulation film on a semiconductor substrate by plasma enhanced atomic layer deposition (PEALD), which comprises:

(i) adsorbing a non-excited non-halide precursor having four or more silicon atoms in its molecule onto a substrate placed in a reaction space;

(ii) supplying an oxygen-free reactant to the reaction space without applying RF power so as to expose the precursor-adsorbed substrate to the reactant; and (iii) after step (ii), applying RF power to the reaction space while the oxygen-free reactant is supplied in the reaction space; and (iv) repeating steps (i) to (iii) as a cycle, thereby depositing an insulation film on the substrate.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not necessarily to scale.

FIG. 2 shows process steps of a PEALD method for depositing a dielectric film according to an embodiment of the present invention.

FIG. 3 shows process steps of a PEALD method for depositing a dielectric film according to another embodiment of the present invention.

FIG. 4 shows process steps of a PEALD method for depositing a dielectric film according to still another embodiment of the present invention.

DETAILED DESCRIPTION

Figure 1:
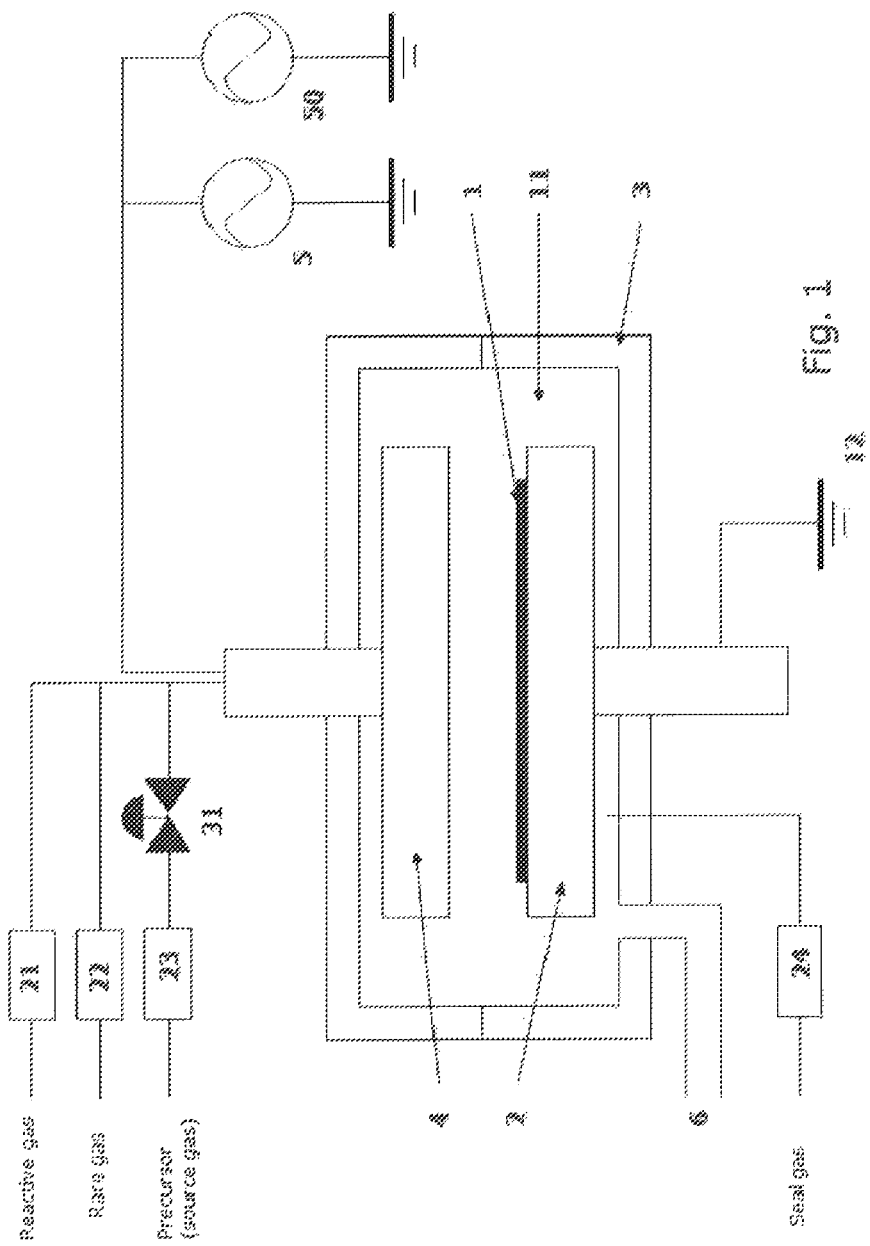
FIG. 1 is a schematic representation of a PEALD apparatus for depositing a dielectric film usable in some embodiments of the present invention.

In this disclosure, a "gas" may include vaporized solid and/or liquid and may be constituted by a single gas or a mixture of gases. Likewise, the article "a" refers to a species or a genus including multiple species. In this disclosure, "a film having Si—C bonds and/or Si—N bonds" may refer to a film characterized by Si—C bonds and/or Si—N bonds, a film constituted mainly or predominantly by Si—C bonds and/or Si—N bonds, a film categorized as Si—C films, Si—N films, or Si—C—N films, and/or a film having a main skeleton substantially constituted by Si—C bonds and/or Si—N bonds.

In this disclosure, the precursor may include a rare gas as a carrier gas when the precursor is vaporized and carried by a rare gas, and the flow of the precursor is controlled by the inflow pressure (the pressure of gas flowing into a reactor). Further, the precursor is a material from which the film is derived and which provides main elements of the film. The precursor contains silicon and can be mixed with a secondary precursor which does not contain silicon such as hydrocarbon gas for a film having Si—C bonds. The reactant gas may be any gas causing surface reaction in an excited state with the precursor chemisorbed on a surface to fix a monolayer of the precursor on the surface by PEALD or other cyclic deposition, or any gas causing reaction with the precursor in an excited atmosphere to deposit a reaction product on the substrate by PEALD or other cyclic deposition. "Chemisorption" refers to chemical saturation adsorption. In this disclosure, when two or more steps can continuously be performed, "continuously" refers to without breaking a vacuum, without interruption as a timeline, without changing treatment conditions, immediately thereafter, as a next step, or without a discrete physical or chemical boundary between two structures in some embodiments. In some embodiments, "film" refers to a layer composed of multiple monolayers (composed of the same monolayers or different monolayers) and continuously extending in a direction perpendicular to a thickness direction substantially without pinholes to cover an entire target or concerned surface, or simply a layer covering a target or concerned surface. A film or layer may be constituted by a discrete single film or a layer having a common characteristic. In this disclosure, any defined meanings do not necessarily exclude ordinary and customary meanings in some embodiments.

In the present disclosure where conditions and/or structures are not specified, a skilled artisan in the art can readily provide such conditions and/or structures, in view of the present disclosure, as a matter of routine experimentation. Also, in the present disclosure including the examples described above, any ranges applied in some embodiments may include or exclude the lower and/or upper endpoints, and any values of variables indicated may refer to precise values or approximate values and include equivalents, and may refer to average, median, representative, majority, etc. in some embodiments.

As described above, in some embodiments, the method of forming an insulation film on a semiconductor substrate by plasma enhanced atomic layer deposition (PEALD) comprises: (i) adsorbing a non-excited non-halide precursor having four or more silicon atoms in its molecule onto a substrate placed in a reaction space; (ii) supplying an oxygen-free reactant to the reaction space without applying RF power so as to expose the precursor-adsorbed substrate to the reactant; and (iii) after step (ii), applying RF power to the reaction space while the oxygen-free reactant is supplied in the reaction space; and (iv) repeating steps (i) to (iii) as a cycle, thereby depositing an insulation film on the substrate. By using a non-excited non-halide precursor having four or more silicon atoms (typically four to six silicon atoms) in its molecule, the molecular weight of the precursor becomes high, and the precursor having a relatively high molecular weight can improve chemisorption onto a surface of a substrate. The "non-excited" gas refers to a gas which is not in an excited state typically created by using energy such as RF power. If the precursor is excited, the precursor accumulates on the surface of the substrate beyond a chemical saturation adsorption process, e.g., beyond a monolayer.

In some embodiments, the weight-average molecular weight of the non-halide precursor is about 150 to about 500, typically about 200 to about 400. In some embodiments, the non-halide precursor is oxygen-free and/or nitrogen-free. In some embodiments, the non-halide precursor has Si—Si bonds and Si—C bonds, and alternatively, the non-halide precursor has Si—Si bonds without Si—C bonds in its molecule. In some embodiments, the non-halide precursor is a cyclic compound such as cyclopentasilane. In some embodiments, the non-halide precursor is a non-cyclic compound such as tris(trimethylsilyl)silane. Also, as the non-halide precursor, neopentasilane, tetrakis(trimethylsilyl)silane or the like can be used. In some embodiments, two or more different precursors can be used in combination, or alternatively, only a single non-halide precursor is used. Since ALD is a self-limiting adsorption reaction process, the amount of deposited precursor molecules is determined by the number of reactive surface sites and is independent of the precursor exposure after saturation, and a supply of the precursor is such that the reactive surface sites are saturated thereby per cycle.

In some embodiments, the method further comprises continuously supplying an inactive gas to the reaction space through the cycle. The inactive gas is a gas which is inactive under normal conditions but does not exclude a gas which becomes active under certain exciting conditions such as application of RF power. The inactive gas includes, but is not limited to, dilution gas and/or carrier gas, and may be at least one gas selected from the group consisting of rare gases such as Ar, He, Kr, and Xe. In some embodiments, the rare gas is He and/or Ar which may be highly effective to increase step coverage. In some embodiments, the inactive gas is used as a purge gas.

In some embodiments, the reactant is supplied continuously through the cycle. The reactant is a gas which is excited by RF power application and reacts with the precursor to deposit a film. In some embodiments, the reactant is a non-excited gas when being supplied to the reaction space, or alternatively, the reactant is radical species of a gas generated by, e.g., a remote plasma unit. In some embodiments, the reactant is at least one gas selected from the group consisting of He, $H_2$, and $N_2$, wherein the insulation file is constituted by amorphous silicon. In some embodiments, a rare gas such as He can be categorized as the inactive gas and also as the reactant. In some embodiments, the reactant is at least one gas selected from the group consisting of a mixed gas of $H_2$ and $N_2$, $NH_3$, and $N_2$, wherein the insulation film is constituted by SiN or SiCN. In the above, in some embodiments, prior to the reactant being excited by RF power, another reactant is supplied and RF power is applied thereto, wherein the another reactant is a rare gas such as He. By performing the rare gas being excited by RF power, the hardness of the resultant film and the compositions of the film can be adjusted. In some embodiments, deposition is conducted in the reaction space under oxygen-free, halogen-free conditions. In some embodiments, no oxygen-containing gas nor hydrocarbon gas is supplied to the reaction space.

In some embodiments, the semiconductor substrate has patterned recesses on which the insulation film is formed, each patterned recess including a top surface, side wall, and bottom surface. In some embodiments, the insulation film has a side wall coverage of typically over 85%, which is defined as a ratio of thickness of film deposited on the side wall to thickness of film deposited on the top surface (e.g., the recess is a Si-line pattern having an opening of 30 to 100 nm and a depth of 200 to 400 nm). In some embodiments, the side wall coverage may be more than 90% or higher, or 95% or higher. In some embodiments, the side wall coverage is substantially similar (e.g., different by less than 7, 5, 3, or 1 percentage points) to the bottom surface coverage, which is defined as a ratio of thickness of film deposited on the bottom surface to thickness of film deposited on the top surface. The bottom surface coverage may be at least about 85%, 90%, or 95%. The above step coverage can be obtained even when the temperature of the substrate is controlled continuously at lower than 300° C. In conventional methods, the side wall coverage is normally 10 to 50 percentage points lower than the bottom surface coverage.

In some embodiments, the reactant is supplied continuously through the cycle, wherein the reactant functions also as a purge gas. When the reactivity between the precursor and the reactant is high, the continuous supply of the reactant may interfere with chemisorptions of the precursor; however, when the reactivity between the precursor and the reactant is relatively low, the continuous supply of the reactant may increase the productivity, i.e., growth rate per cycle. In some embodiments, the method further comprises purging the reaction space between steps (i) and (ii) and between step (iii) and subsequent step (i) in the next cycle. In some embodiments, the method further comprises applying RF power immediately prior to step (ii) after step (i), wherein the method further comprises supplying another reactant while applying RF power immediately prior to step (ii) after step (i). In some embodiments, the another reactant is a rare gas such as He. When RF power is applied to a rare gas prior to step (ii) after step (i), the hardness of the resultant film and the compositions of the resultant film can be adjusted. For example, where the precursor includes carbon atoms, more carbon atoms can be incorporated into the resultant film.

Figures 2, 3:
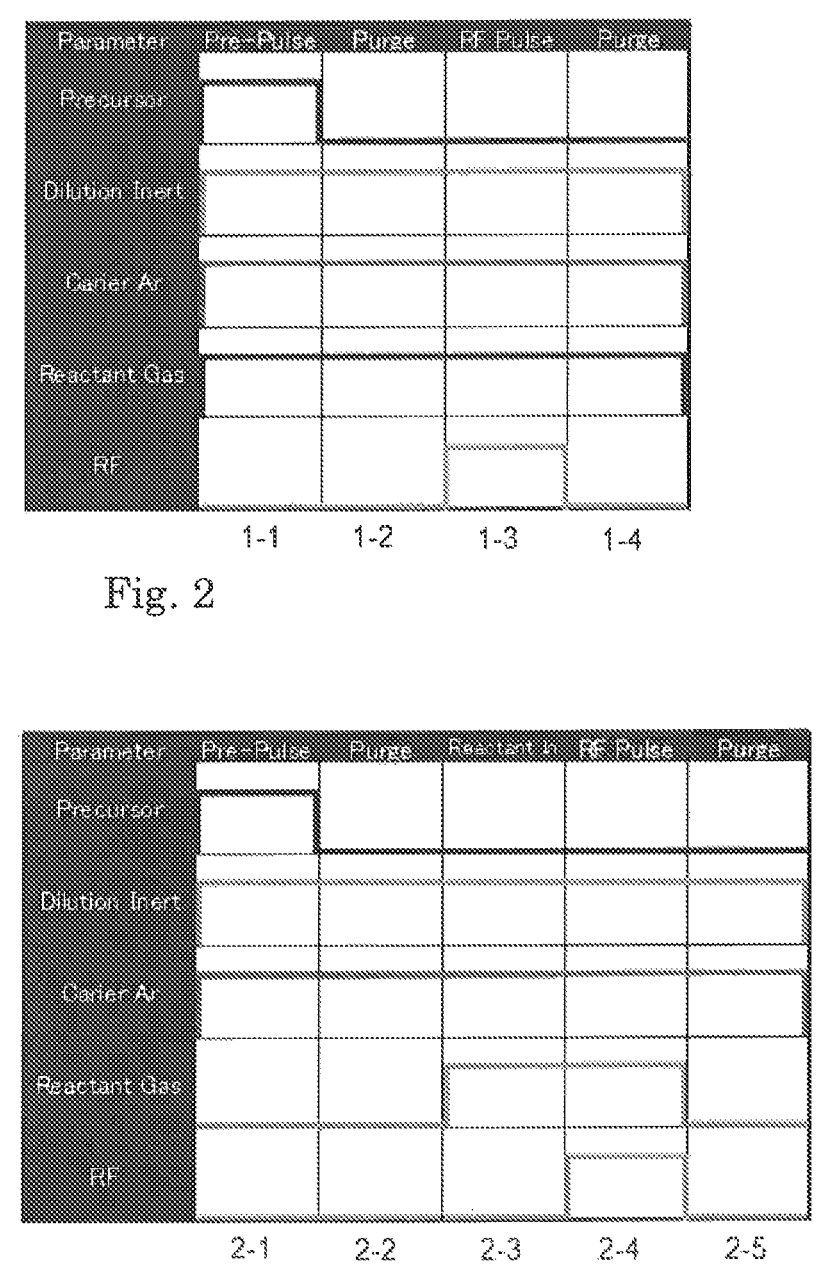

FIG. 2 shows process steps of a PEALD method for depositing a dielectric film according to an embodiment of the present invention (Sequence 1). In FIG. 2, the PEALD method repeats a cycle which is constituted by steps 1-1 to 1-4. In step 1-1 which is a precursor adsorption step, a precursor is supplied in a pulse, a reactant gas is supplied, and no RF power is applied. In step 1-2 which is a purge step, no precursor is supplied, the reactant gas is continuously supplied, and no RF power is applied. The reactant gas functions also as a purge gas. In step 1-3 which is a surface reaction step, no precursor is supplied, the reactant gas is continuously supplied, and RF power is applied, thereby reacting the precursor adsorbed on the surface with the reactant gas to form a monolayer (which refers to a layer formed by one cycle of PEALD and having a thickness of one or more molecules). In step 1-4 which is a purge step, no precursor is supplied, the reactant gas is continuously supplied, and no RF power is applied. The reactant gas functions also as a purge gas. In this embodiment, a dilution inert gas (e.g., rare gas) is continuously supplied throughout steps 1-1 to 1-4, which inert gas also functions as a purge gas. In some embodiments, in step 1-1, two or more precursors can be supplied in separate pulses or in the same pulse. In some embodiments, a separate purge gas can be used for purging, and vacuum can also be used for purging. Steps 1-2 and 1-4 can be conducted in any manner as long as the non-adsorbed precursor in step 1-1 and the non-reacted product in step 1-3 are removed from the surface.

In this embodiment, the precursor is supplied using a carrier gas, wherein the precursor is vaporized in a tank under an equilibrium vaporization pressure, and the vaporized precursor is supplied with a carrier gas to a reactor, wherein the flow of the precursor is controlled by the inflow gas pressure (the pressure of gas flowing into the reactor). Since ALD is a self-limiting adsorption reaction process, the amount of deposited precursor molecules is determined by the number of reactive surface sites and is independent of the precursor exposure after saturation, and a supply of the precursor is such that the reactive surface sites are saturated thereby per cycle.

FIG. 3 shows process steps of a PEALD method for depositing a dielectric film according to an embodiment of the present invention (Sequence 2). In FIG. 3, the PEALD method repeats a cycle which is constituted by steps 2-1 to 2-5. In step 2-1 which is a precursor adsorption step, a precursor is supplied in a pulse, no reactant gas is supplied, and no RF power is applied. In step 2-2 which is a purge step, no precursor is supplied, no reactant gas is supplied, and no RF power is applied. In Sequence 2, as with Sequence 1, a dilution inert gas and a carrier gas are continuously supplied, and they function also as a purge gas. In step 2-3 which is a reactant exposure step, no precursor is supplied, and no RF power is supplied, but a reactant gas is supplied in a pulse so that the precursor-adsorbed surface is exposed to the reactant gas. In step 2-4 which is a surface reaction step, no precursor is supplied, the reactant gas is continuously supplied, and RF power is applied, thereby reacting the precursor adsorbed on the surface with the reactant gas to form a monolayer. In step 2-5 which is a purge step, no precursor is supplied, no reactant gas is supplied, and no RF power is applied. The dilution gas and the carrier gas function also as a purge gas. In some embodiments, in step 2-1, two or more precursors can be supplied in separate pulses or in the same pulse. In some embodiments, a separate purge gas can be used for purging, and vacuum can also be used for purging. Steps 2-2 and 2-5 can be conducted in any manner as long as the non-adsorbed precursor in step 2-1 and the non-reacted product in step 2-4 are removed from the surface.

Figure 4:
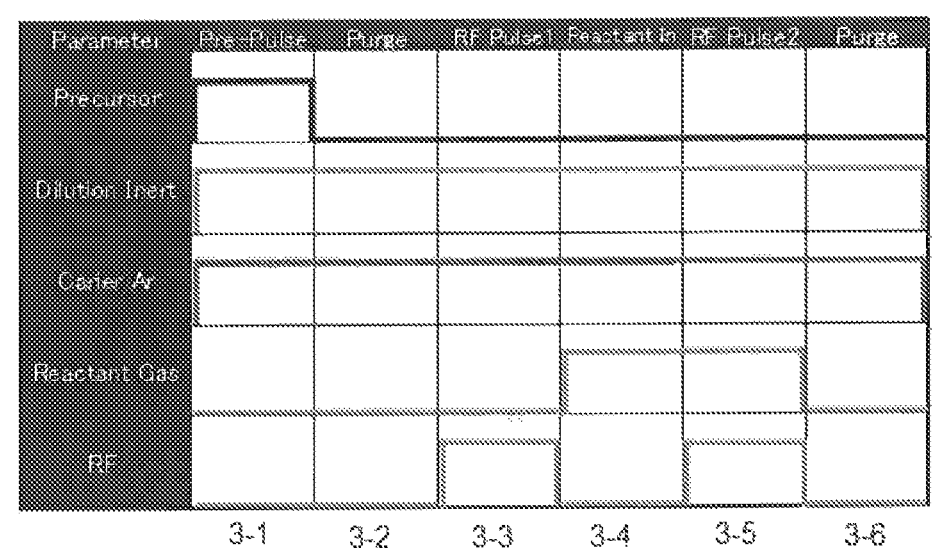

FIG. 4 shows process steps of a PEALD method for depositing a dielectric film according to an embodiment of the present invention (Sequence 3). In FIG. 4, the PEALD method repeats a cycle which is constituted by steps 3-1 to 3-6. Steps 3-1, 3-2, 3-4, 3-5, and 3-6 correspond to steps 2-1, 2-2, 2-3, 2-4, and 2-5 of Sequence 2, respectively, and thus, explanation of these steps is omitted. In this embodiment, step 3-3 is performed. In step 3-3 which is a pre-reaction step, no precursor is supplied, no reactant gas is supplied, but RF power is applied, thereby exposing the precursor adsorbed on the surface to a rare gas plasma to modify the properties and the compositions of the resultant film on the substrate. In some embodiments, in step 3-3, another reactant gas can be supplied in separate pulses or in the same pulse. When two or more reactant gases are used, they may be supplied in different pulses, where neither reactant gas is continuously supplied, where RF power is applied in each step. For example, the first reactant gas is He and the second reactant gas is $N_2$ or $NH_3$, thereby first forming SiC and then nitridizing SiC to form SiCN. Alternatively, the first reactant gas is $N_2$ or $NH_3$ and the second reactant gas is He, thereby first forming SiN and then carbonizing SiN to form SiCN.

In some embodiments, the precursor is supplied together with a secondary precursor, such as hydrocarbon for films having Si—C bonds, in the same pulses. In some embodiments, the reactant gas is a mixed gas of $N_2$ and $H_2$, wherein the flow ratio of $N_2$ to $H_2$ is in a range of 1/10 to 10/1, preferably 1/3 to 5/1.

In some embodiments, the duration of each step of Sequences 1 to 3 is shown in Table 1 below.

TABLE 1

| Sequence 1 | | Sequence 2 | | Sequence 3 | |
|---|---|---|---|---|---|
| Step | Duration (sec.) | Step | Duration (sec.) | Step | Duration (sec.) |
| 1-1 | 0.1~2 | 2-1 | 0.1~2 | 3-1 | 0.1~2 |
| 1-2 | 0.5~2 | 2-2 | 0.5~2 | 3-2 | 0.5~2 |
| 1-3 | 0.5~10 | 2-3 | 0.5~5 | 3-3 | 0.5~10 |
| 1-4 | 0.1~0.5 | 2-4 | 0.5~10 | 3-4 | 0.5~5 |
| | | 2-5 | 0.3~10 | 3-5 | 0.5~10 |
| | | | | 3-6 | 0.3~10 |

In PEALD, in some embodiments, the following conditions may be employed:
ALD Cycle:
Substrate temperature: 0 to 500° C. (preferably room temperature to about 300° C., or about 50° C. to about 200° C.)
Precursor pressure: 50 to 1333 Pa (preferably about 100 to about 500 Pa, depending on the vapor pressure of the precursor)
Carrier gas (e.g., Ar or He) flow: 500 to 4,000 sccm (preferably about 1,000 to about 2,500 sccm)
Precursor pulse: 0.1 to 10 seconds (preferably about 0.3 to about 3 seconds)
Purge upon the precursor pulse: 0.1 to 10 seconds (preferably about 0.3 to about 3 seconds)
Optional purge gas flow: 100 to 2,000 sccm (preferably about 300 to 1,500 sccm)
RF frequency: 13.56 to 60 MHz
RF power: 10 to 1,500 W (preferably about 100 to about 800 W for a 300-mm wafer)
RF power pulse: 0.1 to 20 seconds (preferably about 0.5 to 10 seconds)
Reactant gas flow: 500 to 4,000 sccm (preferably about 1,000 to 3,000 sccm)
Reactant gas (secondary gas) flow: 0 to 4,000 sccm (e.g., He; preferably, about 1,000 to about 3,000 sccm)
Purge upon the RF power pulse: 0.1 to 10 seconds (preferably about 0.3 to about 3 seconds)
Optional purge gas flow: 100 to 2,000 sccm (preferably about 300 to 1,500 sccm)
Duration of one cycle (except for the growth control step): 1 to 30 seconds
Number of cycles repeated: 300 to 1,000
Thickness of film: 5 to 30 nm FIG. 1 is a schematic view of a plasma ALD reactor with flow control valves, which can be used in some embodiments of the present invention.

In this example, by providing a pair of electrically conductive flat-plate electrodes 4, 2 in parallel and facing each other in the interior 11 of a reaction chamber 3, applying HRF power (13.56 MHz or 27 MHz) 5 and LRF power of 5 MHz or less (400 kHz-500 kHz) 50 to one side, and electrically grounding 12 the other side, a plasma is excited between the electrodes. A temperature regulator is provided in a lower stage 2 (the lower electrode), and a temperature of a substrate 1 placed thereon is kept constant at a given temperature. The upper electrode 4 serves as a shower plate as well, and reaction gas and rare gas are introduced into the reaction chamber 3 through a gas flow controller 23, a pulse flow control valve 31, and the shower plate. Additionally, in the reaction chamber 3, an exhaust pipe 6 is provided through which gas in the interior 11 of the reaction chamber 3 is exhausted. Additionally, the reaction chamber is provided with a seal gas flow controller 24 to introduce seal gas into the interior 11 of the reaction chamber 3 (a separation plate for separating a reaction zone and a transfer zone in the interior of the reaction chamber is omitted from this figure). For the pulse flow control valve 31, a pulse supply valve that is used for ALD can suitably be used in some embodiments.

The disclosed embodiments will be explained with reference to specific examples which are not intended to limit the present invention. The numerical values applied in the specific examples may be modified by a range of at least ±50% in other conditions, wherein the endpoints of the ranges may be included or excluded. In the present disclosure where conditions and/or structures are not specified, the skilled artisan in the art can readily provide such conditions and/or structures, in view of the present disclosure, as a matter of routine experimentation.

EXAMPLE

Method and Conditions

Insulation films (SiN, SiCN, and a-Si) were each formed on a 300-mm substrate having a patterned surface having an aspect ratio of about 2 and an opening width of about 50 nm under the conditions shown below using Sequences 1 to 3 illustrated in FIGS. 2, 3, and 4, respectively, and the apparatus illustrated in FIG. 1. The thickness of film was 30 nm for evaluating film properties. The conditions of PEALD are shown in Tables 2 and 3 below:

TABLE 2

| Sequence 1 | | Sequence 2 | | Sequence 3 | |
|---|---|---|---|---|---|
| Step | Duration (sec.) | Step | Duration (sec.) | Step | Duration (sec.) |
| 1-1 | 0.5 | 2-1 | 0.5 | 3-1 | 0.5 |
| 1-2 | 1 | 2-2 | 1 | 3-2 | 1 |
| 1-3 | 1 | 2-3 | 2 | 3-3 | 1 |
| 1-4 | 0.3 | 2-4 | 1 | 3-4 | 2 |
| | | 2-5 | 0.3 | 3-5 | 1 |
| | | | | 3-6 | 0.3 |

TABLE 3

| EX | Precursor | SQ | Film | Reactant: (SLM) | Dilution (SLM) | RF (W) | P (Pa) | G (min) | T (° C.) |
|---|---|---|---|---|---|---|---|---|---|
| 0 | Hexachlorodisilane | 1 | SiN | NH3: 3 | Ar: 1 | 200 | 300 | 12 | 400 |
| 0' | Hexachlorodisilane | 1 | SiN | NH3: 3 | Ar: 1 | 200 | 300 | 12 | 100 |
| 0'' | Hexachlorodisilane | 1 | SiN | H2/N2: 1 | Ar: 1 | 200 | 300 | 12 | 100 |
| 1 | Cyclopentasilane | 1 | SiN | NH3: 3 | Ar: 1 | 400 | 300 | 12 | 400 |
| 2 | Cyclopentasilane | 2 | SiN | NH3: 3 | Ar: 1 | 400 | 300 | 12 | 400 |
| 3 | Cyclopentasilane | 1 | SiN | N2/H2: 3 | Ar: 1 | 400 | 300 | 12 | 100 |
| 4 | Cyclopentasilane | 1 | a-Si | H2: 1 | He: 1 | 150 | 400 | 12 | 100 |
| 5 | Cyclopentasilane | 1 | a-Si | He: 3 | — | 200 | 300 | 12 | 100 |
| 6 | Tris(trimethylsilyl)silane | 1 | SiCN | NH3: 2 | Ar: 1 | 400 | 200 | 14 | 100 |

TABLE 3-continued

| EX | Precursor | SQ | Film | Reactant: (SLM) | Dilution (SLM) | RF (W) | P (Pa) | G (min) | T (°C.) |
|---|---|---|---|---|---|---|---|---|---|
| 7 | Tris(trimethylsilyl)silane | 3* | SiCN | He⇒N2 (3⇒1) | Ar: 1 | 400 | 200 | 14 | 100 |

P: Pressure,
G: Gap between upper and lower electrodes,
T: susceptor temperature
3* in Example 7 refers to modified Sequence 3 wherein He was supplied in step 3-3 in Sequence 3.

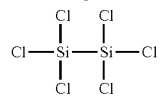

Hexachlorodisilane

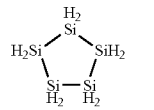

Cyclopentasilane

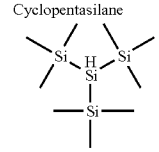

Tris(trimethylsilyl)silane

Results

The films obtained above were examined, and the results are shown in Table 4.

TABLE 4

| EX | Process Mode | GPC (nm/cycle) | Sidewall Coverage (%) | Bottom Coverage (%) | Non-uniformity (1σ%) |
|---|---|---|---|---|---|
| 0 | ALD | 0.03 | 95 | 92 | 1.1 |
| 0' | ALD | 0.005 | 41 | 90 | 1.3 |
| 0" | ALD | 0.004 | 40 | 87 | 1.4 |
| 1 | ALD | 0.07 | 92 | 96 | 0.6 |
| 2 | ALD | 0.06 | 94 | 98 | 0.5 |
| 3 | ALD | 0.11 | 89 | 94 | 0.7 |
| 4 | ALD | 0.005 | 93 | 96 | 0.9 |
| 5 | ALD | 0.003 | 86 | 87 | 1.2 |
| 6 | ALD | 0.07 | 91 | 98 | 1.3 |
| 7 | ALD | 0.12 | 87 | 89 | 1.4 |

As shown in Table 4, when the halide precursor was used to form a SiN film, although the growth per cycle (GPC), step coverage, and uniformity were good when the process temperature was as high as 400° C. in Example 0, they were significantly degraded when the process temperature was 100° C. in Examples 0' and 0". In particular, in Examples 0' and 0", the side wall coverage was poor and the GPC was very low, indicating that nitridation did not sufficiently occur at relatively low temperatures. When the non-halide precursor was used to form a SiN film in Example 1, the GPC was significantly improved by over 50% and the non-uniformity was significantly reduced by about 50% at a temperature of 400° C. while the step coverage was comparable as compared with those in Example 0. The excellent GPC and the uniformity were substantially maintained and the step coverage was improved even when the reaction gas supply was pulsed in Example 2, as compared with those in Example 1, where the reactant gas supply was continuous. Surprisingly, the excellent GPC was further improved and the step coverage and the uniformity were comparable even when the process temperature was 100° C. in Example 3, as compared with those in Example 1. When the non-halide precursor was used to form an a-Si film in Examples 4 and 5, as good GPC as that for depositing an a-Si film, good step coverage, and good uniformity were obtained, although when the dilution gas (He) was used in Example 4, the above properties were improved as compared with those in Example 5. When the non-halide precursor including Si—C bonds was used to form a SiCN film in Examples 6 and 7, the GPC, step coverage, and uniformity were good even when the process temperature was 100° C. When the two reactant gases were used in steps while applying RF power in Example 7, the GPC was improved as compared with that in Example 6.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:
1. A method of forming an insulation film on a semiconductor substrate by plasma enhanced atomic layer deposition (PEALD), which comprises:
 (i) adsorbing a non-excited non-halide precursor having four or more silicon atoms in its molecule onto a substrate placed in a reaction space, thereby producing a precursor-adsorbed substrate;
 (ii) supplying an oxygen-free reactant to the reaction space without applying RF power so as to expose the precursor-adsorbed substrate to the oxygen-free reactant, said oxygen-free reactant consisting of $NH_3$ or a combination of He and $N_2$; and
 (iii) after step (ii), applying RF power to the reaction space while the oxygen-free reactant is supplied in the reaction space; and
 (iv) repeating steps (i) to (iii) as a cycle, thereby depositing an insulation film on the substrate wherein the insulation film is constituted by SiN or SiCN.

2. The method according to claim 1, further comprising continuously supplying an inactive gas to the reaction space through the cycle.

3. The method according to claim 1, wherein the oxygen-free reactant is supplied continuously through the cycle.

4. The method according to claim 1, further comprising purging the reaction space between steps (i) and (ii) and between step (ill) and subsequent step (i) in the next cycle.

5. The method according to claim 1, wherein the non-excited non-halide precursor is a cyclic compound.

6. The method according to claim 5, wherein the non-excited non-halide precursor is cyclopentasilane.

7. The method according to claim 1, wherein the non-excited non-halide precursor is a non-cyclic compound.

8. The method according to claim 7, wherein the non-excited non-halide precursor is tris(trimethylsilyl)silane.

9. The method according to claim 1, wherein the non-excited non-halide precursor is oxygen-free and nitrogen-free.

10. The method according to claim 1, wherein the substrate is controlled continuously at a temperature lower than about 300° C.

11. The method according to claim 1, wherein the substrate has patterned recesses on its surface, and the insulation film is deposited on the surface.

12. The method according to claim 11, wherein the insulation film has a sidewall coverage of about 90% or higher.

13. A method of forming an insulation film on a semiconductor substract by plasma enhanced atomic layer deposition (PEALD), which comprises:
    (i) absorbing a non-excited non-halide precursor having four or more silicon atoms in its molecule onto a substrate placed in a reaction space, thereby producing a precursor-adsorbed substrate;
    (ii) supplying an oxygen-free reactant to the reaction space without applying RF power so as to expose the precursor-adsorbed substrate to the oxygen-free reactant; and
    (iii) after step (ii), applying RF power to the reaction space while the oxygen-free reactant is supplied in the reaction space; and
    (iv) repeating steps (i) to (iii) as a cycle, thereby depositing and insulation film on the substrate,
    said method further comprising purging the reaction space between steps (i) and (ii) and between step (iii) and subsequent step (i) in the next cycle, and further comprising applying RF power in a pulse immediately prior to step (ii) after step (i), and supplying another reactant while applying RF power immediately prior to step (ii) after step (i).

14. The method according to claim 13, wherein the another reactant is a rare gas.

15. A method of forming an insulation film on a semiconductor substrate by plasma enhanced atomic layer deposition (PEALD), which comprises:
    (i) absorbing a non-excited non-halide precursor having four or more silicon atoms in its molecule onto a substrate placed in reaction space, thereby producing a precursor-absorbed substrate;
    (ii) supplying an oxygen-free reactant to the reaction space without applying RF power so as to expose the precursor-adsorbed substrate to the oxygen-free reactant, said oxygen-free reactant consisting of He, $H_2$, or a mixture of He and $H_2$; and
    (iii) after step (ii), applying RF power to the reaction space while the oxygen-free reactant is supplied in the reaction space; and
    (iv) repeating steps (i) to (iii) as a cycle, thereby depositing an insulation film on the substrate,
    wherein the insulation film is constituted by amorphous silicon.

* * * * *